(12) United States Patent
Hu et al.

(10) Patent No.: US 11,695,101 B2
(45) Date of Patent: Jul. 4, 2023

(54) DISPLAY PANEL, METHOD FOR MANUFACTURING THE DISPLAY PANEL, AND DISPLAY DEVICE

(71) Applicant: Xiamen Tianma Micro-Electronics Co., Ltd., Xiamen (CN)

(72) Inventors: Yuqi Hu, Shanghai (CN); Jujian Fu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 141 days.

(21) Appl. No.: 17/138,209

(22) Filed: Dec. 30, 2020

(65) Prior Publication Data
US 2022/0085259 A1   Mar. 17, 2022

(30) Foreign Application Priority Data

Sep. 17, 2020  (CN) .......................... 202010980847.6

(51) Int. Cl.
| | |
|---|---|
| *H01L 33/60* | (2010.01) |
| *H01L 25/075* | (2006.01) |
| *H01L 27/12* | (2006.01) |
| *H01L 33/58* | (2010.01) |
| *H01L 33/62* | (2010.01) |

(52) U.S. Cl.
CPC .......... *H01L 33/60* (2013.01); *H01L 25/0753* (2013.01); *H01L 27/1214* (2013.01); *H01L 33/58* (2013.01); *H01L 33/62* (2013.01); *H01L 2933/0058* (2013.01); *H01L 2933/0066* (2013.01)

(58) Field of Classification Search
CPC ..... H01L 25/0753; H01L 33/60; H01L 33/62; H01L 33/58; H01L 2933/0066; H01L 2933/0058
See application file for complete search history.

(56) References Cited

U.S. PATENT DOCUMENTS

| | | | |
|---|---|---|---|
| 2013/0266629 A1* | 10/2013 | Arvidsson | A61C 8/00 424/653 |
| 2015/0115293 A1* | 4/2015 | Wu | H01L 24/24 438/28 |
| 2020/0266176 A1* | 8/2020 | Ichikawa | H01L 25/0753 |
| 2020/0343406 A1* | 10/2020 | Watanabe | H01L 27/156 |

FOREIGN PATENT DOCUMENTS

| | | |
|---|---|---|
| CN | 207116483 U | 3/2018 |
| CN | 110192282 A | 8/2019 |
| CN | 110402496 A | 11/2019 |

* cited by examiner

*Primary Examiner* — Feifei Yeung Lopez
(74) *Attorney, Agent, or Firm* — Alston & Bird LLP

(57) ABSTRACT

A display panel includes a substrate; first electrodes and an auxiliary electrode disposed on a top side of the substrate, a plurality of light-emitting elements disposed on first electrodes and an auxiliary electrode, a second electrode, and a conductive barrier. The first pole of one light-emitting element is connected to one of the first electrodes. The second electrode is disposed on the light-emitting elements and connected to a second pole of one of the light-emitting elements. The conductive barrier is disposed between two adjacent light-emitting elements and electrically connected to the auxiliary electrode and the second electrode. Each of the two sidewalls of the conductive barrier includes a reflective electrode for reflecting light emitted by an adjacent light-emitting element.

20 Claims, 14 Drawing Sheets

DISPLAY PANEL, METHOD FOR MANUFACTURING THE DISPLAY PANEL, AND DISPLAY DEVICE

CROSS-REFERENCE TO RELATED APPLICATION

This application claims priority to a Chinese patent application No. CN202010980847.6 filed on Sep. 17, 2020, entitled "DISPLAY PANEL, METHOD FOR MANUFACTURING THE DISPLAY PANEL, AND DISPLAY DEVICE", the disclosure of which is incorporated herein by reference in its entirety.

TECHNICAL FIELD

Embodiments of the present disclosure relate to the field of display technologies and, in particular, to a display panel, a method for manufacturing the display panel and a display device.

BACKGROUND

Micro light-emitting diode (micro-LED) is a new generation of display technology. Compared with a conventional organic light-emitting diode (OLED), the micro-LED has many advantages and has become a new research hotspot in the display technology field. However, a conventional micro light-emitting diode in the related art has the disadvantages of high power consumption and low luminescence efficiency.

SUMMARY

The present disclosure provides a display panel, a method for manufacturing the display pane, and a display device to reduce the power consumption of the display panel and improve the luminescence efficiency of the display panel.

In a first aspect, embodiments of the present disclosure provide a display panel. The display panel includes a substrate having a top side and a bottom side; a plurality of first electrodes and an auxiliary electrode disposed on the top side of the substrate; a plurality of light-emitting elements; a second electrode; and a conductive barrier.

The light-emitting elements are disposed on the first electrodes and the auxiliary electrode. The first pole of one of the plurality of light-emitting elements is connected to one of the plurality of first electrodes.

The second electrode is disposed on the light-emitting elements and connected to a second pole of one of the plurality of light-emitting elements.

The conductive barrier is disposed between two adjacent ones of the plurality of light-emitting elements and is electrically connected to the auxiliary electrode and the second electrode. The conductive barrier includes two sidewalls, each of the two sidewalls includes a reflective electrode, and the reflective electrode reflects light emitted from an adjacent one of the plurality of light-emitting elements.

In a second aspect, embodiments of the present disclosure further provide a display device including the display panel described in the first aspect.

In a third aspect, embodiments of the present disclosure further provide a method for manufacturing a display panel. The manufacturing method includes providing a substrate; forming a plurality of first electrodes and an auxiliary electrode on the substrate; forming a plurality of light-emitting elements on the substrate, where the first pole of one of the plurality of light-emitting element is connected to one of the plurality of first electrodes; forming a conductive barrier at least between two adjacent ones of the plurality of light-emitting elements; and forming a second electrode on the plurality of light-emitting elements, where the second electrode is connected to the second pole of one of the plurality of light-emitting elements.

The conductive barrier is electrically connected to the auxiliary electrode and the second electrode, the conductive barrier includes two sidewalls, each of the two sidewalls includes a reflective electrode, and the reflective electrode reflects light emitted from an adjacent one of the plurality of light-emitting elements.

The display panel provided in embodiments of the present disclosure includes a substrate having a top side and a bottom side; a plurality of first electrodes and an auxiliary electrode on the top side of the substrate; a plurality of light-emitting elements; a second electrode; and a conductive barrier. The light-emitting elements are disposed on the first electrodes and the auxiliary electrode. The first pole of one light-emitting element is connected to one first electrode. The second electrode is disposed on the light-emitting elements and connected to a second pole of one light-emitting element. The conductive barrier is disposed between two adjacent light-emitting elements and electrically connected to the auxiliary electrode and the second electrode. The conductive barrier includes two sidewalls, each of the two sidewalls includes a reflective electrode, and the reflective electrode reflects light emitted from an adjacent one of the plurality of light-emitting elements. A driving signal on the auxiliary electrode is applied to the second pole of the light-emitting element through the conductive barrier and the second electrode. The auxiliary electrode is located at least between two adjacent light-emitting elements, so the signal transmission path between the auxiliary electrode and the light-emitting element is shorter, and the voltage drop of the driving signal is smaller. Thus, the brightness of the display panel can be larger in the case of a smaller driving signal. In this manner, the power consumption of the display panel is reduced, and the luminescence efficiency of the display panel is improved.

BRIEF DESCRIPTION OF DRAWINGS

Other features, objects and advantages of the present disclosure will become more apparent after a detailed description of non-limiting embodiments with reference to the drawings below is read.

DETAILED DESCRIPTION

Figure 1:
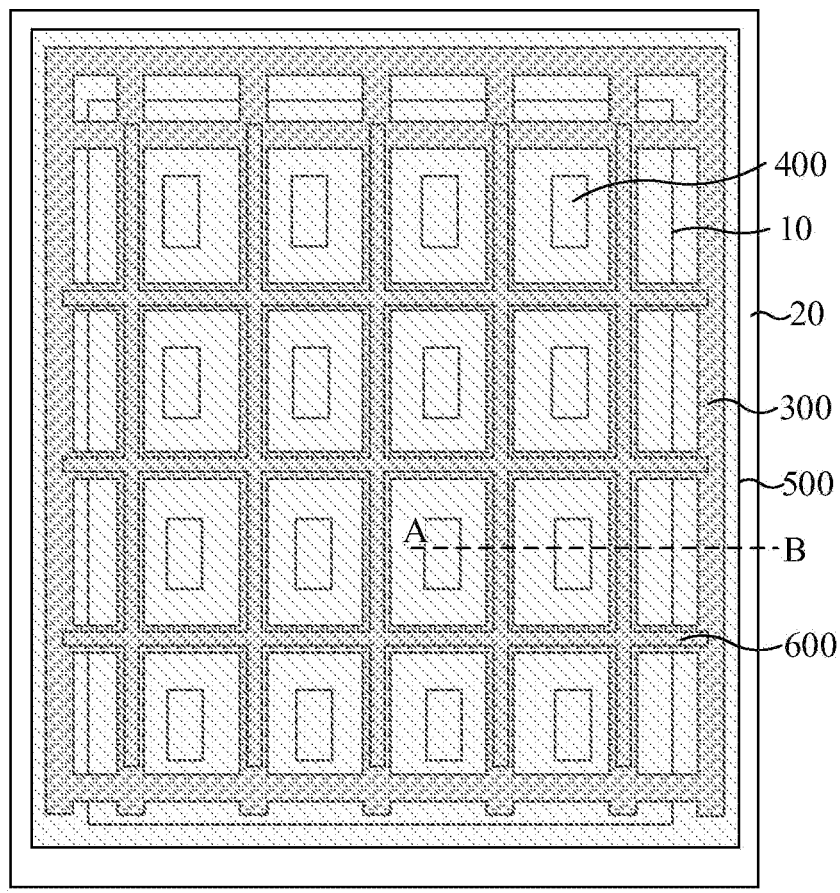
FIG. 1 is a top view of a display panel according to embodiments of the present disclosure.

To further elucidate technical means and effects for achieving intended objects of the present disclosure, implementations, structures, features and effects of a display panel, a method for manufacturing the display panel and a display device according to the present disclosure are described hereinafter in detail in conjunction with the drawings and preferred embodiments.

Embodiments of the present disclosure provide a display panel. The display panel includes a substrate; a plurality of first electrodes and an auxiliary electrode on the side of the substrate; a plurality of light-emitting elements; a second electrode; and a conductive barrier.

The light-emitting elements are located on a side, away from the substrate, of the first electrodes and the auxiliary electrode. The first pole of each of the plurality of light-emitting elements is connected to a respective one of the plurality of first electrodes.

The second electrode is located on a side, away from the substrate, of the light-emitting elements and connected to a second pole of each of the plurality of light-emitting elements.

The conductive barrier is located at least between two adjacent light-emitting elements and electrically connected to the auxiliary electrode and the second electrode. Each of lateral surfaces, facing a respective adjacent light-emitting element, of the conductive barrier is provided with a reflective electrode, and the reflective electrode is configured to reflect light emitted by the respective light-emitting element.

The display panel provided in embodiments of the present disclosure includes a substrate; a plurality of first electrodes and an auxiliary electrode on the side of the substrate; a plurality of light-emitting elements; a second electrode; and a conductive barrier. The light-emitting elements are located on the side, away from the substrate, of the first electrode and the auxiliary electrode. The first pole of one light-emitting element is connected to the first electrode. The second electrode is located on the side, away from the substrate, of the light-emitting elements and connected to a second pole of each of the plurality of light-emitting elements. The conductive barrier is located at least between two adjacent light-emitting elements and electrically connected to the auxiliary electrode and the second electrode. Each of lateral surfaces of the conductive barrier facing a respective adjacent light-emitting element is provided with a reflective electrode, and the reflective electrode is configured to reflect light emitted by the respective light-emitting element. A cathode signal on the auxiliary electrode is applied to the second pole of each light-emitting element through the conductive barrier and the second electrode. The auxiliary electrode is located at least between two adjacent light-emitting elements, so the signal transmission path between the auxiliary electrode and each light-emitting element is shorter, and the voltage drop of the cathode signal is smaller. Thus, the brightness of the display panel can be larger in the case of a smaller cathode signal. In this manner, the power consumption of the display panel is reduced, and the luminescence efficiency of the display panel is improved.

The preceding discloses some of the core ideas of the present application. Technical solutions in embodiments of the present disclosure are described clearly and completely below in conjunction with the drawings in embodiments of the present disclosure. Apparently, the embodiments described below are part, not all, of the embodiments of the present disclosure. Based on the embodiments described herein, all other embodiments obtained by those skilled in the art without doing creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the intension of the present disclosure. Therefore, the present disclosure is not limited to the embodiments below.

Additionally, the present disclosure is described in detail in conjunction with the drawings. In the detailed description of embodiments of the present disclosure, for ease of description, schematic views illustrating structures of devices and components are not partially enlarged to a general proportional scale. The schematic views are merely illustrative and are not intended to limit the scope of the present disclosure. Additionally, actual manufacturing includes three-dimensional spatial sizes: length, width and height.

A light-emitting element in a micro-LED display panel usually uses a vertical micro-LED. The first pole of the light-emitting element is electrically connected to an anode. The second pole of the light-emitting element is electrically connected to a cathode. The anode is electrically connected to a pixel driver circuit one to one in the display area. The cathode is an entire-layer structure and is electrically connected to a cathode signal line in the non-display area. The cathode is formed of Indium tin oxide (ITO) material having a large square resistance, so the voltage drop between the second pole of the vertical micro-LED far from the cathode signal line and the cathode signal line is relatively large. To ensure the brightness of the screen, the vertical micro-LED is required to be driven by a large voltage. As a result, the power consumption of the display panel is high and the luminescence efficiency of the display panel is low.

To solve the preceding problem, embodiments of the present disclosure provide a display panel. An auxiliary electrode is disposed to reduce the voltage drop between the second pole of an LED and a cathode signal line, thereby achieving the effects of reducing the power consumption of the display panel and improving the luminescence efficiency of the display panel.

Figure 2:
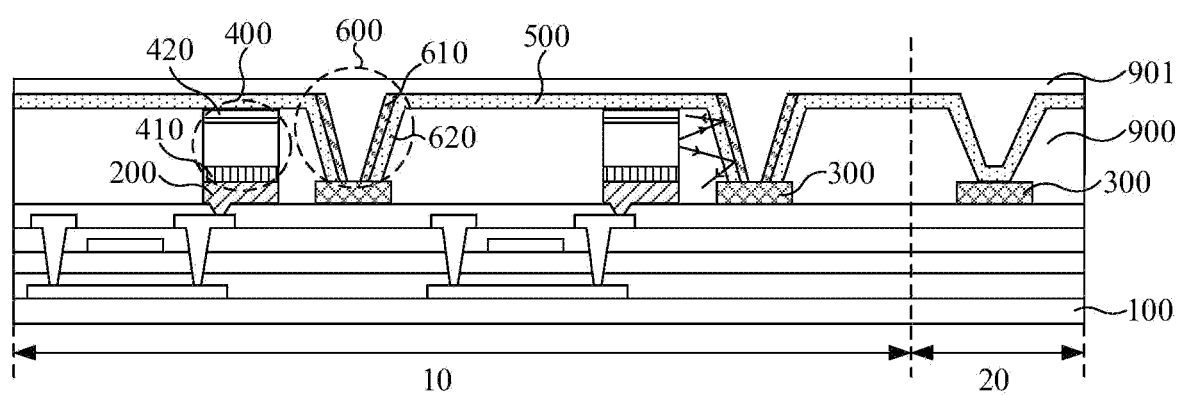
FIG. 2 is a cross-sectional view taken along the dashed line A-B of FIG. 1.

FIG. 1 is a top view of a display panel according to embodiments of the present disclosure. FIG. 2 is a cross-sectional view taken along the dashed line A-B of FIG. 1. As shown in FIG. 2, the display panel includes a substrate 100; a plurality of first electrodes 200 and an auxiliary electrode 300 on a side of the substrate; a plurality of light-emitting elements 400; a second electrode 500; and a conductive barrier 600. The light-emitting elements 400 are located on the side, away from the substrate 100, of the first electrodes 200 and the auxiliary electrode 300. The first pole 410 of each light-emitting element 400 is connected to the first electrode 200. The second electrode 500 is located on the side, away from the substrate 100, of the light-emitting elements 400 and connected to the second pole 420 of each light-emitting element 400. The conductive barrier 600 is located at least between two adjacent light-emitting elements 400 and electrically connected to the auxiliary electrode 300 and the second electrode 500. Each of the lateral surfaces, facing a respective adjacent light-emitting element 400, of the conductive barrier 600 is provided with a reflective electrode 610, and the reflective electrode 610 is configured to reflect light emitted by the respective light-emitting element 400.

Exemplarily, each light-emitting element 400 may be a micro-LED or an OLED. This is not limited in this embodiment. Additionally, the auxiliary electrode 300 may be a single-layer conductive film or a laminated structure composed of multiple conductive films, for example, a Ti/Al/Ti laminated structure. Optionally, the auxiliary electrode 300 may be disposed in the same layer as an inherent conductive film in the display panel. Here, the auxiliary electrode 300 may be made of the same material as the film in the same layer.

Optionally, the conductive barrier 600 may be disposed only between two adjacent light-emitting elements 400, as shown in FIG. 1, or the conductive barrier 600 may be disposed both between two adjacent light-emitting elements 400 and in the non-display area 20. With continued reference to FIG. 1, in the case where the conductive barrier 600 is disposed only between two adjacent light-emitting elements 400, the non-display area 20 may be provided with an auxiliary electrode 300, and the second electrode 500 is electrically connected to the auxiliary electrode 300, as shown in FIG. 2. It is understandable that when the second electrode 500 is a cathode, the auxiliary electrode 300 located in the non-display area 20 and electrically connected to the second electrode 500 can replace a cathode signal line in the related art and be used for transmitting a cathode signal. Correspondingly, the auxiliary electrode 300 in the display area 10 is also used for transmitting a cathode signal. In this case, the first electrode 200 is an anode, the first pole of a light-emitting element 400 is a P electrode, and the second pole of the light-emitting element 400 is an N electrode.

It is to be noted that FIG. 2 exemplarily illustrates only the case where the auxiliary electrode 300 and the first electrode 200 are in the same layer and this case does not constitute a limit to other possible arrangements. In other implementations of this embodiment, the auxiliary electrode 300 may be located in any film on a side, close to the substrate 100, of the light-emitting elements 400.

Optionally, as shown in FIG. 2, the side, facing away from the substrate 100, of the second electrode 500 and the conductive barrier 600 may be provided with an encapsulation structure 901. The encapsulation structure 901 may be, for example, an encapsulation film to prevent external humidity from entering the positions of the light-emitting elements 400 and affecting the performance of the light-emitting elements 400.

It is to be noted that each light-emitting element 400 is surrounded by an auxiliary electrode 300, so the signal transmission path between the second pole 420 of each light-emitting element 400 and the adjacent auxiliary electrode 300 is short, and the voltage drop of the corresponding driving signal is small. Thus, the driving signal applied to the auxiliary electrode 300 can be transmitted to the second pole 420 of each light-emitting element 400 in the case of a small voltage drop, and the brightness of the display panel can be larger in the case of a smaller driving signal. In this manner, the power consumption of the display panel is reduced, and the luminescence efficiency of the display panel is improved.

Additionally, the conductive barrier 600 is disposed between two adjacent light-emitting elements 400. Each of lateral surfaces, facing a respective adjacent light-emitting element, of the conductive barrier 600 is provided with a reflective electrode 610 so that the reflective electrode 610 can change the propagation path of light emitted by the respective adjacent light-emitting element 400. The specific light path is shown in FIG. 2. In this manner, the following problem is prevented: light emitted by each light-emitting element 400 is propagated to the light-emitting area of a respective adjacent light-emitting element 400 and mixed with a light having a different color and emitted by the respective adjacent light-emitting element 400, resulting in color mixture that leads to color cast of light emitted by the respective adjacent light-emitting element 400, thereby affecting the display effect of the display panel.

Figure 3:
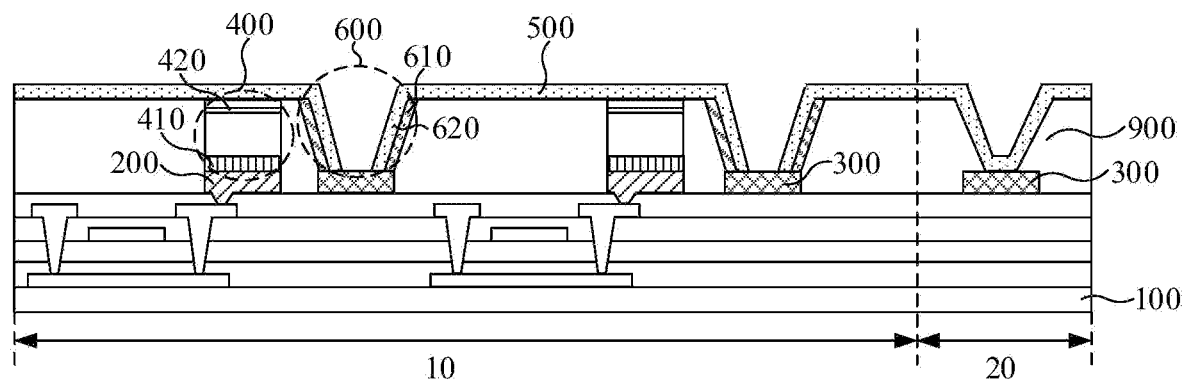
FIG. 3 is another cross-sectional view taken along the dashed line A-B of FIG. 1.

It is understandable that when the reflective electrode 610 is conductive, the conductive barrier 600 may include only the reflective electrode 610, or as shown in FIG. 2, the conductive barrier 600 may include other structures in addition to the reflective electrode 610, such as a first film 620 integrally formed with the second electrode 500. Generally, the second electrode 500 is made of ITO material. The ITO film is a transparent film that does not block light emitted by light-emitting elements 400. Therefore, the reflective electrode 610 may be located on the side, close to the respective adjacent light-emitting element 400, of the first film 620, as shown in FIG. 3, or the reflective electrode 610 may be located on the side, farther from the respective adjacent light-emitting element 400, of the first film 620, as shown in FIG. 2.

Optionally, the first film 620 and the second electrode 500 may be formed in the same process step to simplify the process of manufacturing the display panel. On this basis, as regards the structure where the reflective electrode 610 is located on the side, farther from the adjacent light-emitting element 400, of the first film 620, the second electrode 500 is formed before the reflective electrode 610 is formed, and the second electrode 500 covers the entire upper surface of the planarization layer 900. The upper surface, farther from the planarization layer 900, of the second electrode 500 is flat without a height difference, so the deposition surface of the reflective electrode 610 is flat, and the quality of film formation is better.

Exemplarily, the value range of the reflectivity of the reflective electrode for visible light is: a≥30%, where a is the reflectivity of the reflective electrode.

It is to be noted that if the reflectivity of the reflective electrode 610 for visible light is too low, then light emitted by the adjacent light-emitting element cannot be effectively reflected by the reflective electrode 610, and most of the light passes through the reflective electrode 610 and enters the light-emitting area of the adjacent light-emitting element 400, affecting the display effect of the display panel. Additionally, light emitted by a light-emitting element 400 of a conventional display panel generally includes visible light like red light, blue light and green light. Experiments show that when the reflectivity of the reflective electrode 610 for visible light is equal to or greater than 30%, the reflective electrode 610 can effectively reflect red, blue and green light emitted by the light-emitting element 400, thereby improving the display effect of the display panel.

Specifically, the reflective electrode 610 may be made of material having a conductivity lower than the second electrode 500, for example, magnesium or silver.

Figure 4:
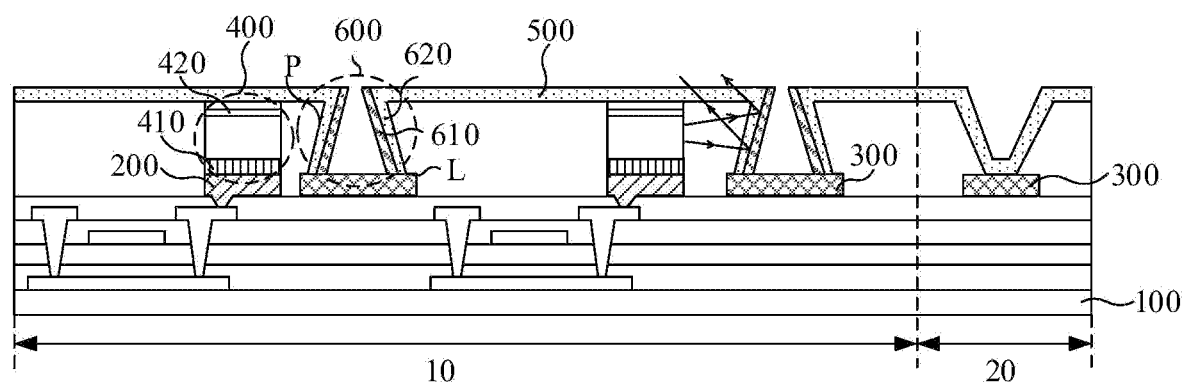
FIG. 4 is another cross-sectional view taken along the dashed line A-B of FIG. 1.

FIG. 4 is another cross-sectional view taken along the dashed line A-B of FIG. 1. The structure of the display panel shown in FIG. 4 is similar to the structure of the display panel shown in FIG. 2 except that the angle α between the lateral surface P, facing the respective adjacent light-emitting element 400, of the conductive barrier 600 and the surface L, facing the second electrode 500, of a respective portion of auxiliary electrode 300 is less than 90°.

It is to be noted that the lateral surface P, facing the respective adjacent light-emitting element 400, of the conductive barrier 600 tilts to the light-emitting surface of the display panel so that light emitted by the respective adjacent light-emitting element 400 can be reflected by the reflective electrode 610 to the light-emitting surface of the display panel. The specific light path is shown in FIG. 4. In this manner, the luminescence efficiency of the display panel is improved while color mixture of light emitted by the respective adjacent light-emitting element 400 is prevented.

Figure 5:
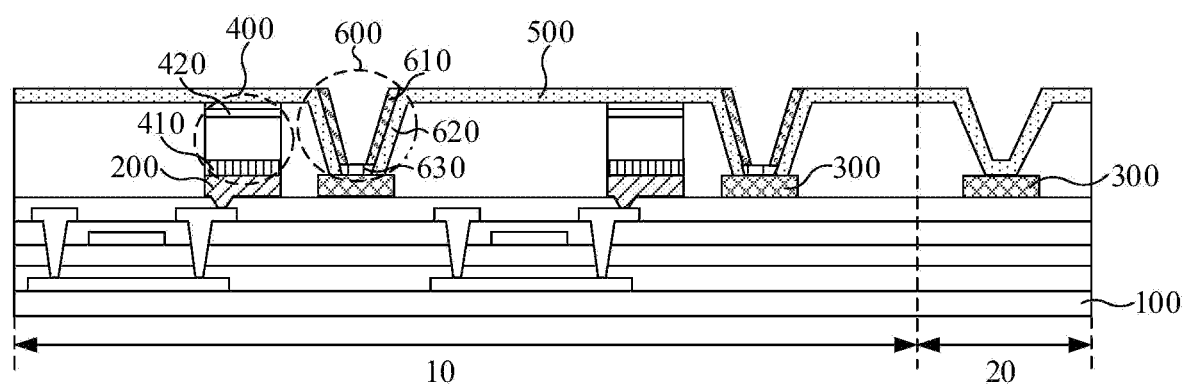
FIG. 5 is another cross-sectional view taken along the dashed line A-B of FIG. 1.

FIG. 5 is another cross-sectional view taken along the dashed line A-B of FIG. 1. Based on the display panel shown in FIG. 1, the conductive barrier 600 further includes a contact electrode 630 that is located on the side, close to the second electrode 500, of the auxiliary electrode 610 and is in contact with the auxiliary electrode 300.

It is to be noted that during the normal operation of the display panel, the contact electrode 630 and the auxiliary electrode 300 are connected in parallel. The parallel resistance of the two is smaller than the resistance of the auxiliary electrode 300, helping accelerate transmission of a driving signal applied to the auxiliary electrode 300 to the second pole 420 of the adjacent light-emitting element 400 and reduce the loss of the driving signal during the transmission process.

It is to be noted that FIG. 5 exemplarily illustrates only the case where the contact electrode 630 is in contact with the reflective electrode 610 and this case does not constitute a limit. In other implementations of this embodiment, the contact electrode 630 may be separate from the reflective electrode 610 and be in contact with only the auxiliary electrode 300.

Figure 6:
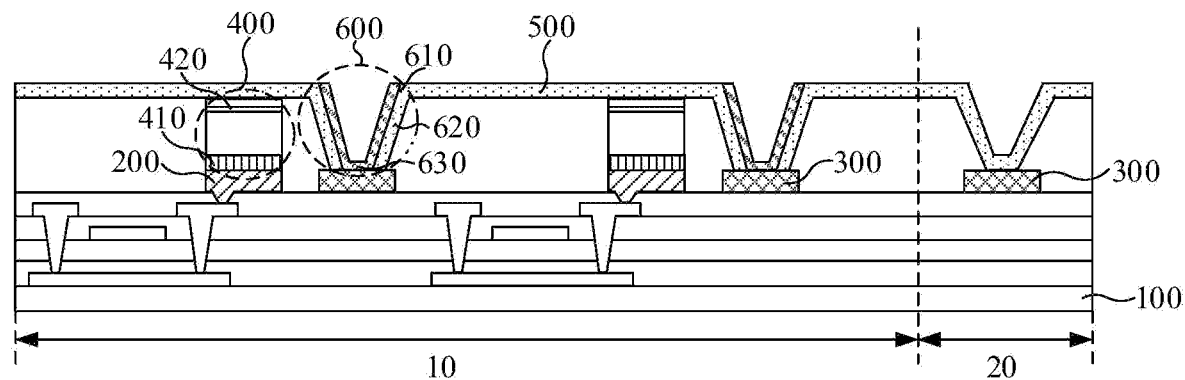
FIG. 6 is another cross-sectional view taken along the dashed line A-B of FIG. 1.

Optionally, FIG. 6 is another cross-sectional view taken along the dashed line A-B of FIG. 1. As shown in FIG. 6, the contact electrode 630 and the reflective electrode 610 are integrally formed and are made of the same material.

It is to be noted that this arrangement allows the contact electrode 630 and the reflective electrode 610 to be formed in the same process step, and thus there is no need to provide a corresponding process step for manufacturing the contact electrode 630 separately, helping simplify the process of manufacturing the display panel.

Figure 7:
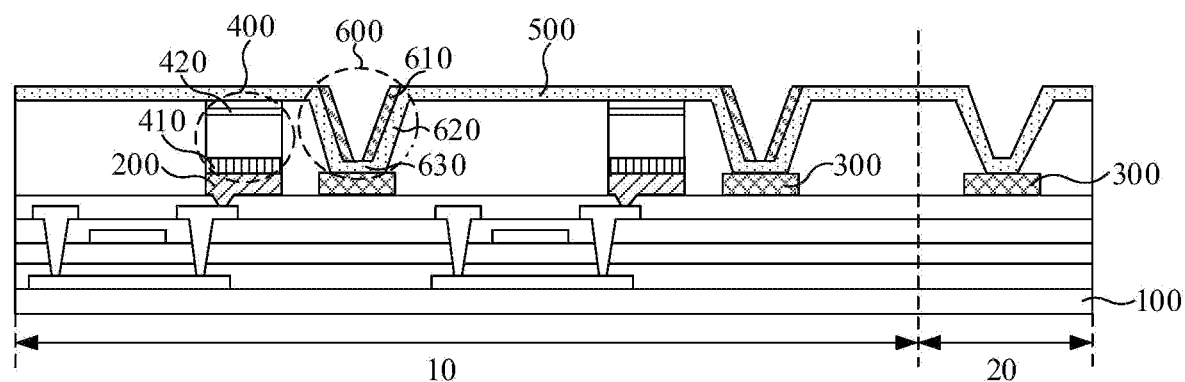
FIG. 7 is another cross-sectional view taken along the dashed line A-B of FIG. 1.

FIG. 7 is another cross-sectional view taken along the dashed line A-B of FIG. 1. In another implementation of this embodiment, as shown in FIG. 7, the contact electrode 630 and the second electrode 500 may be integrally formed and be made of the same material.

It is to be noted that this arrangement allows the contact electrode 630 and the second electrode 500 to be formed in the same process step, and thus there is no need to provide a corresponding process step for manufacturing the contact electrode 630 separately, helping simplify the process of manufacturing the display panel. Additionally, when the light-emitting element 400 is a micro-LED, the first electrode 200 is usually an ITO/Ag/ITO laminated structure, the second electrode 500 is usually made of ITO material, and the integrally formed contact electrode 630 and second electrode 500 are made of ITO material correspondingly. In this manner, the surface of the contact electrode 630 and the surface of the second electrode 500 that are in contact are made of the same material, generating a lower contact resistance that facilitates transmission of a driving signal.

Figure 8:
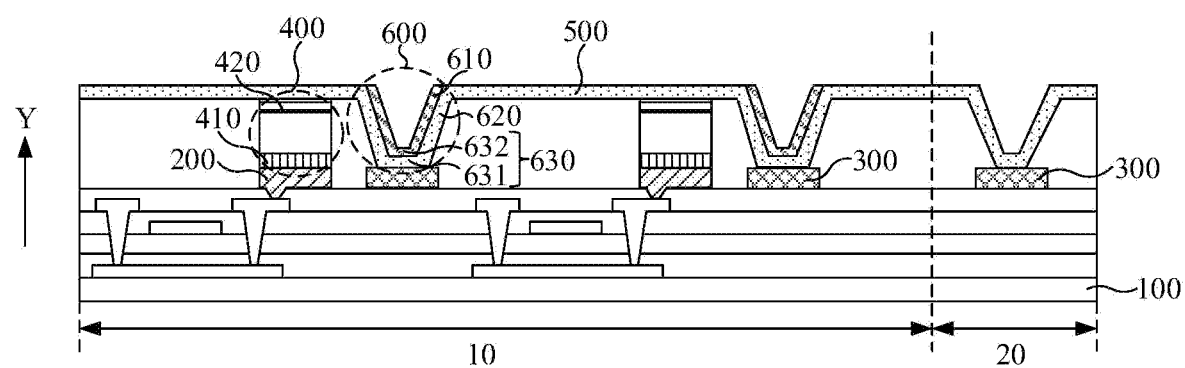
FIG. 8 is another cross-sectional view taken along the dashed line A-B of FIG. 1.

FIG. 8 is another cross-sectional view taken along the dashed line A-B of FIG. 1. In another implementation of this embodiment, as shown in FIG. 8, the contact electrode 630 includes a first sub-electrode 631 and a second sub-electrode 632, the first sub-electrode 631 and the second sub-electrode 632 are stacked in a first direction Y, and the second electrode 500 and the reflective electrode 600 are stacked in the first direction Y. The first sub-electrode 631 and the second electrode 500 are integrally formed and are made of the same material. The second sub-electrode 632 and the reflective electrode 610 are integrally formed and are made of the same material.

In this embodiment, the second electrode 500 and the reflective electrode 610 are stacked in the first direction Y in the following manner: The second electrode 500 is formed before the reflective electrode 610 is formed. In this manner, the order in which the second electrode 500 and the reflective electrode 610 are stacked is the same as the order in which the first sub-electrode 631 and the second sub-electrode 632 are stacked. Thus, in terms of structure, the first sub-electrode 631 and the second electrode 500 can be integrally formed, and the second sub-electrode 632 and the reflective electrode 610 can be integrally formed.

It is to be noted that the arrangement, in which the first sub-electrode 631 and the second electrode 500 are integrally formed and are made of the same material and the second sub-electrode 632 and the reflective electrode 610 are integrally formed and are made of the same material, allows the first sub-electrode 631 and the second electrode 500 to be formed in the same process step and allows the second sub-electrode 632 and the reflective electrode 610 to be formed in the same process step, and thus there is no need to provide a corresponding process step for manufacturing the contact electrode 630 separately, helping simplify the process of manufacturing the display panel.

With continued reference to FIGS. 5 to 8, the reflective electrode 610 and the contact electrode 630 may form a groove structure.

In this manner, each of the reflective electrode 610 and the contact electrode 630 is a relatively thin, facilitating formation of the reflective electrode 610 and the contact electrode 630 by using a thin film deposition technology, making the formation technology of the two compatible with the formation technology of other films of the display panel.

Figure 9:
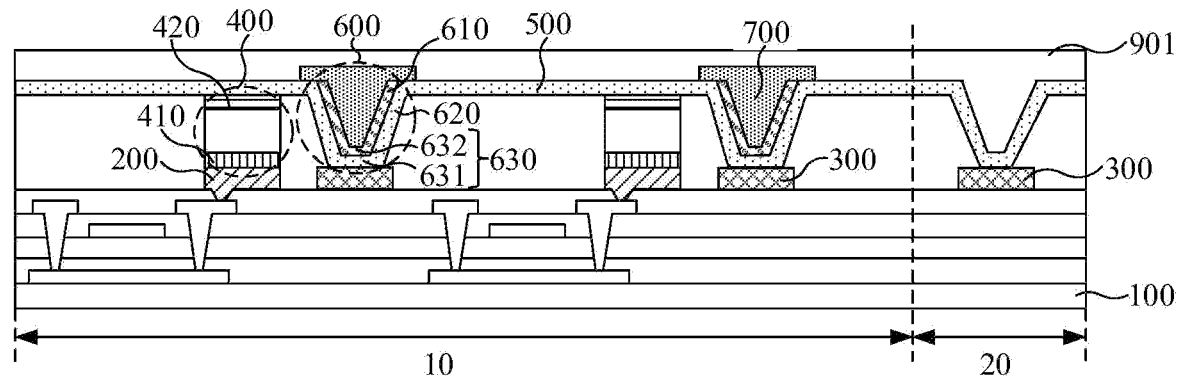
FIG. 9 is another cross-sectional view taken along the dashed line A-B of FIG. 1.

Optionally, based on the groove structure formed by the reflective electrode 610 and the contact electrode 630, as shown in FIG. 9, the display panel further includes a light-blocking layer 700 that is located on the side, away from the substrate 100, of the conductive barrier 600, covers the reflective electrode 610, and fills the groove structure.

Exemplarily, the light-blocking layer 700 may be made of optically opaque material. The side, away from the substrate 100, of the light-blocking layer 700 and the second electrode 500 may be provided with an encapsulation structure 901.

It is to be noted that the light-blocking layer 700 has a light-blocking effect that can prevent the reflective electrode 610 from reflecting light incident from the outside, thereby preventing a mirror effect and thus facilitating improvement of the display effect of the display panel.

It is to be noted that the arrangement in which the light-blocking layer 700 fills the groove structure can, on the one hand, increase the partial thickness of the light-blocking layer 700 and enhance the light-blocking effect of the light-blocking layer 700 and, on the other hand, improve the flatness of the surface, away from the substrate, of the display panel and facilitate subsequent encapsulation. Additionally, the thickness of the reflective electrode 610 is generally small. Light emitted by one light-emitting element 400 cannot be completely reflected by the reflective electrode 610. A small part of the light passes through the reflective electrode 610 and then enters the light-emitting area of the adjacent light-emitting element 400. If the adjacent light-emitting element 400 emits light normally, the light passing through the reflective electrode 610 and the light emitted by the adjacent light-emitting element 400 undergo color mixture, reducing the purity of the monochromatic light emitted by the adjacent light-emitting element 400. If the adjacent light-emitting element 400 is in the dark state in the case where the light-emitting element 400 is a micro-LED, the color of the light passing through the reflective electrode 610 is blue, and the light-emitting color of the adjacent light-emitting element 400 is red or green, then the blue light in the light-emitting area of the adjacent light-emitting element 400 activates the light-emitting element 400 in this area, causing the pure blue image to be partial white. In this embodiment, the light-blocking layer 700 fills the groove structure, preventing the light passing through the reflective electrode 610 from entering the light-emitting area of the adjacent light-emitting element 400, thereby avoiding the preceding problem and helping improve the display effect of the display panel.

Figure 10:
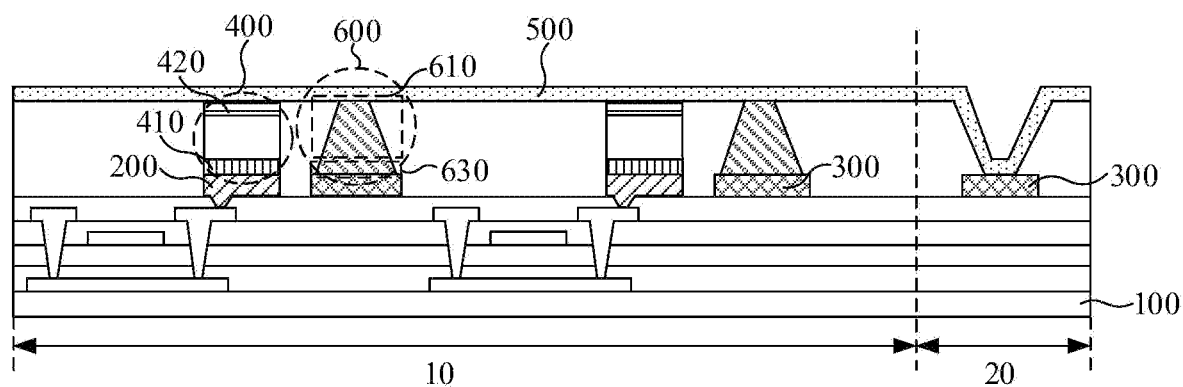
FIG. 10 is another cross-sectional view taken along the dashed line A-B of FIG. 1.

FIG. 10 is another cross-sectional view taken along the dashed line A-B of FIG. 1. As shown in FIG. 10, based on the arrangement in which the conductive barrier 600 further includes a contact electrode 630 that is located on the side, away from the second electrode 500, of the auxiliary electrode 610 and is in contact with the auxiliary electrode 300, the conductive barrier 600 is a metal barrier, and the reflective electrode 610 and the contact electrode 630 are made of the same material as the metal barrier.

It is to be noted that the real meaning of the structure of the display panel shown in FIG. 10 is that the conductive barrier 600 is an integral structure, the reflective electrode 610 and the contact electrode 630 have no actual boundary, and the conductive barrier 600 is located between the second electrode 500 and the auxiliary electrode 300 and formed before the second electrode 500 is formed.

It is also to be noted that the conductive barrier 600 shown in FIG. 10 has a simple structure, and because the conductive barrier 600 is a single metal structure, the conductivity of the conductive barrier 600 is good so that a driving signal can be better transmitted and the transmission loss of the driving signal is reduced.

Figure 11:
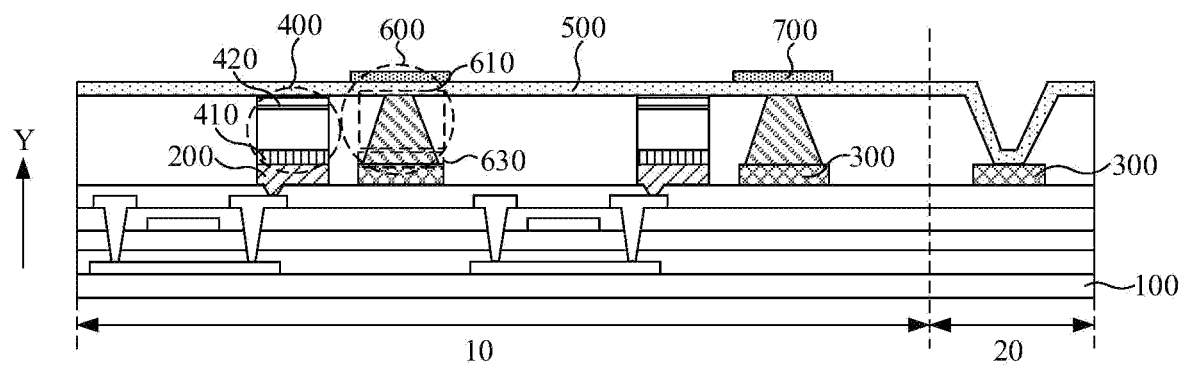
FIG. 11 is another cross-sectional view taken along the dashed line A-B of FIG. 1.

FIG. 11 is another cross-sectional view taken along the dashed line A-B of FIG. 1. As shown in FIG. 11, the display panel further includes a light-blocking layer 700 that is located on a side, away from the substrate 100, of the conductive barrier 600 and covers the reflective electrode 610 in a direction Y perpendicular to the plane where the display panel is located.

It is to be noted that the arrangement of the light-blocking layer 700 is applicable to all other display panel structures within the protection scope of the present embodiments in addition to the display panel structure shown in FIG. 11, for example, applicable to the display panel structure shown in FIG. 9.

It is to be noted that the arrangement of the light-blocking layer 700 helps eliminate a mirror effect caused by the reflective electrode 610 and improve the display effect of the display panel.

With continued reference to FIGS. 3 to 11, the auxiliary electrode 300 and the first electrode 200 may be disposed in the same layer.

In this manner, on the one hand, the auxiliary electrode 300 and the first electrode 200 can be formed in the same process, and there is no need to provide dedicated process steps separately, helping simplify the process of manufacturing the display panel, and on the other hand, the auxiliary electrode 300 and the first electrode 200 occupy only one film space, facilitating thinning of the display panel. Additionally, the first electrode 200 is closer to the second electrode 500 than other conductive films between the substrate 100 and the light-emitting elements 400 so that during the process of manufacturing the conductive barrier 600, the depth of the via connecting the auxiliary electrode 300 and the second electrode 500 is smaller and the manufacturing difficulty is lower.

Figure 12:
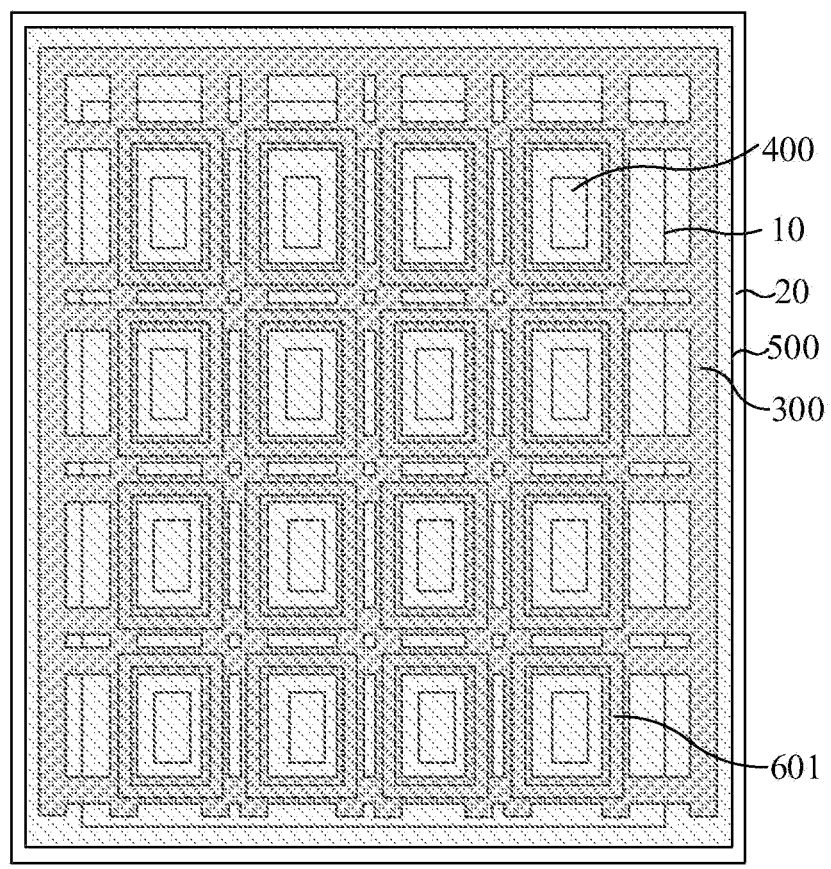
FIG. 12 is a top view of another display panel according to the embodiments of the present disclosure.

FIG. 12 is a top view of another display panel according to the embodiments of the present disclosure. As shown in FIG. 12, the auxiliary electrode 300 has a grid structure, and the perpendicular projections of the light-emitting elements 400 on the plane where the auxiliary electrode 300 is located fall in openings of the grid structure; the conductive barrier includes a plurality of sub-conductive barriers 601, the sub-conductive barriers 601 are in one-to-one correspondence with the light-emitting elements 400, and each sub-conductive barrier 601 is disposed around a respective light-emitting element.

Figure 13:
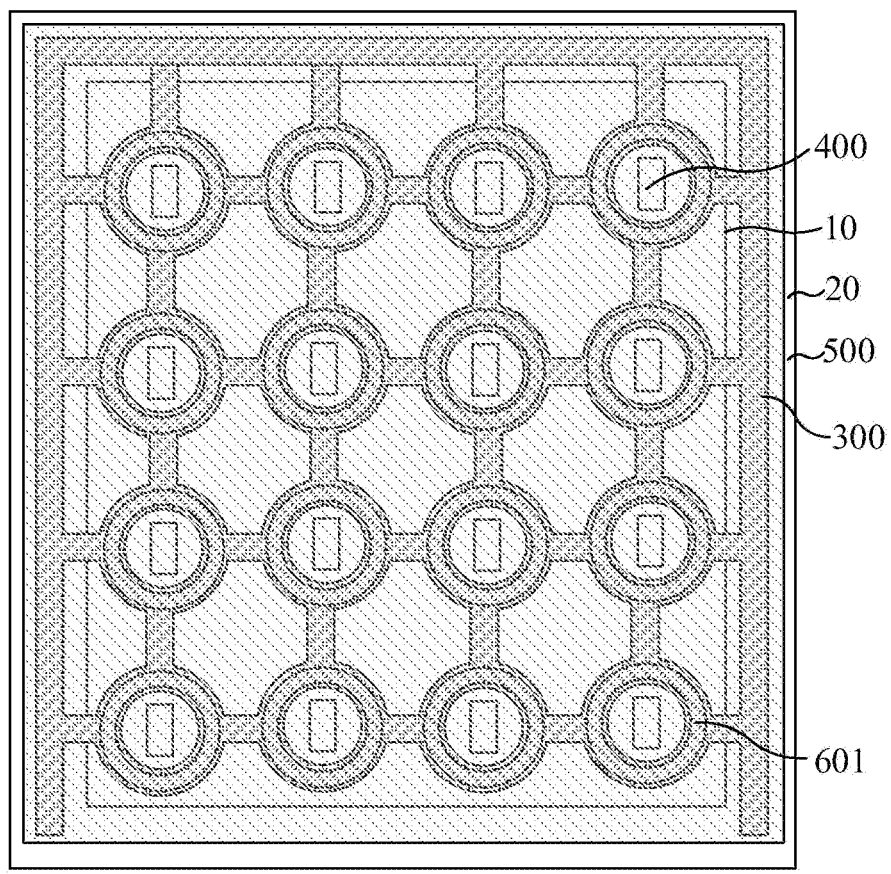
FIG. 13 is a top view of another display panel according to the embodiments of the present disclosure.

It is to be noted that FIG. 12 exemplarily illustrates only the case where the shape of each sub-conductive barrier 601 is rectangular and this case does not constitute a limit. In other implementations of this embodiment, each sub-conductive barrier 601 may be other-shaped such as circular, as shown in FIG. 13. It is understandable that to ensure good contact between the conductive barrier and the auxiliary electrode 300, the grid structure of the auxiliary electrode 300 is adaptively adjusted according to the shape of the conductive barrier, as shown in FIGS. 12 and 13 by way of example.

It is also to be noted that with the arrangement in which each sub-conductive barrier 601 is disposed around a respective light-emitting element 400, light emitted from the adjacent light-emitting element 400 can be prevented from color mixture effectively, and light emitted from the light-emitting element 400 to the periphery can all be reflected by the reflective electrode to the light-emitting surface of the display panel, so the luminescence efficiency of the display panel can be improved effectively.

With continued reference to FIGS. 12 and 13, the auxiliary electrode 300 is a grid structure that is partly in the display area 10 and partly in the non-display area 20. A width of each grid line of the grid structure is relatively narrow. In order for a driving signal to be transmitted to the grid structure more evenly, the driving signal can be directly applied to the grid structure.

Figure 14:
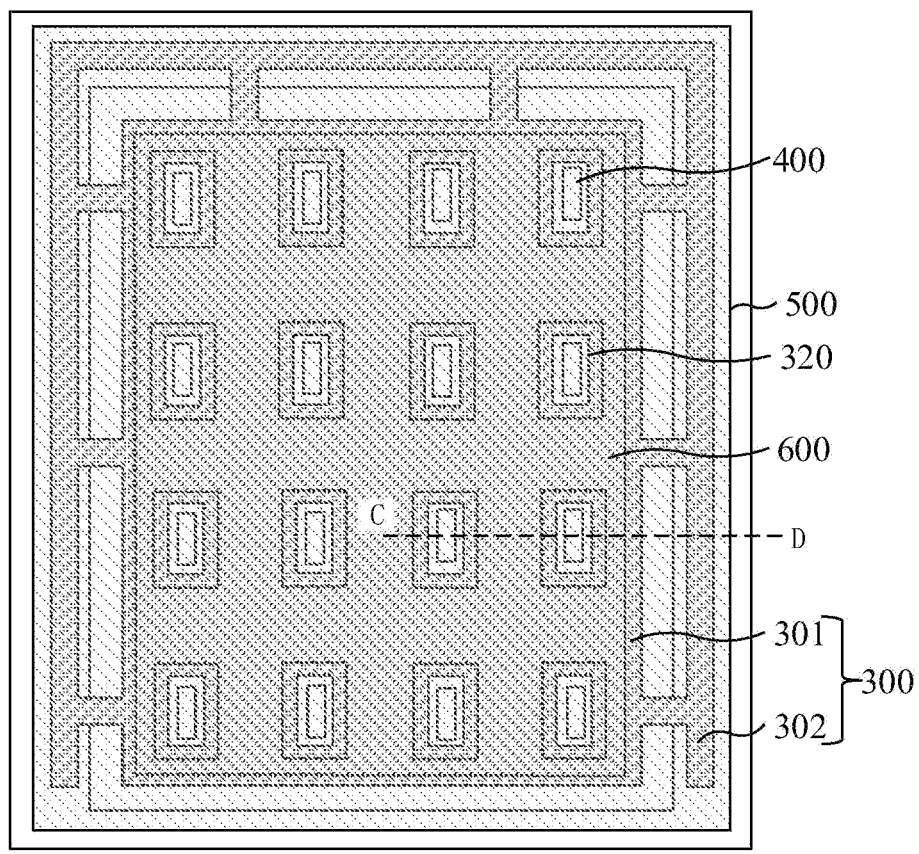
FIG. 14 is a top view of another display panel according to the embodiments of the present disclosure.
Figure 15:
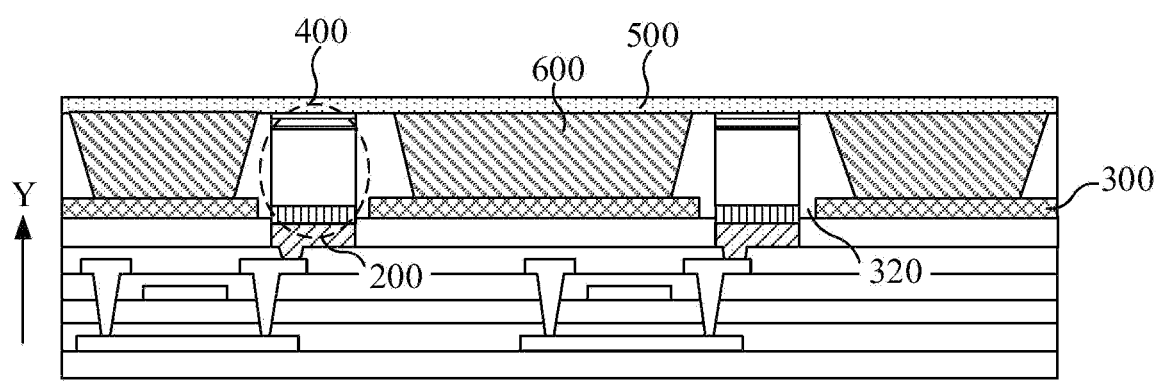
FIG. 15 is a cross-sectional view taken along the dashed line C-D of FIG. 14.

FIG. 14 is a top view of another display panel according to the embodiments of the present disclosure. FIG. 15 is a cross-sectional view taken along the dashed line C-D of FIG. 14. As shown in FIG. 15, the auxiliary electrode 300 is located between the first electrode 200 and the light-emitting elements 400 in a direction Y perpendicular to the display panel.

It is to be noted that the auxiliary electrode 300 and inherent films in the display panel are disposed in different layers, so there is no direct influence between the auxiliary electrode 300 and other films, and the shape of the auxiliary electrode 300 can be set freely so that the auxiliary electrode 300 and the conductive barrier 600 can play their roles better.

In other implementations of this embodiment, when the auxiliary electrode 300 and inherent films in the display panel are all disposed in different layers, the auxiliary electrode 300 may also be disposed in a layer between adjacent films which are between the substrate 100 and the first electrode 200.

With continued reference to FIG. 14, the auxiliary electrode 300 includes a first sub-auxiliary electrode 301 located in the display area 10 and a second sub-auxiliary electrode 302 located in the non-display area 20. The first sub-auxiliary electrode 301 is an entire-layer structure. The second sub-auxiliary electrode 302 is a strip structure extending along the edge of the display area 10. The first sub-auxiliary electrode 301 is connected to the second sub-auxiliary electrode 302. Specifically, the second sub-auxiliary electrode 302 has a strip structure and is located in the non-display area 20, facilitating electrical connection to a driving signal line. Additionally, the corresponding driving signal line is not required to be routed through the display area 10 so that space allocation of the display area 10 is not affected. Thus, the driving signal can be directly applied to the second sub-auxiliary electrode 302 and then transmitted from the second sub-auxiliary electrode 302 to the first sub-auxiliary electrode 301.

Optionally, as shown in FIGS. 14 and 15, the auxiliary electrode 300 includes a hollowed-out structure 320, and the perpendicular projections of the light-emitting elements 400 on the layer where the auxiliary electrode 300 is located are located in the hollowed-out structure 320.

It is to be noted that the shape of the hollowed-out structure 320 is not limited in this embodiment, and the hollowed-out structure 320 can be any-shaped as long as the light-emitting elements 400 can be accommodated.

It is also to be noted that on the one hand, the auxiliary electrode 300 provided with a hollowed-out structure does not affect the normal operation of the light-emitting elements 400, and on the other hand, the auxiliary electrode 300 covers a larger area so that the conductive barrier 600 can be larger in size, the transmission path of a driving signal between the auxiliary electrode 300 and the second pole of the adjacent light-emitting element 400 is wider, the resistance is lower, the transmission speed of the driving signal is faster, and the signal loss during transmission is lower.

Optionally, the conductivity of the auxiliary electrode 300 is m, the conductivity of the second electrode 500 is n, and the conductivity of the reflective electrode 610 is p, where m>n, and m>p.

It is to be noted that limited by the functions of the second electrode 500 and the reflective electrode 610, the materials of the two are usually fixed. For example, the second electrode 500 is usually made of transparent conductive material ITO, and the reflective electrode 610 is usually made of optically opaque conductive material with better reflectivity. Therefore, the conductivity of the second electrode 500 and the conductivity of the reflective electrode 610 are relatively constant, and the auxiliary electrode 300 serves as only a driving-signal transmission component and has no other effect. It is only required to increase the conductivity of the auxiliary electrode 300 to achieve better transmission of a driving signal. For this reason, the conductivity of the auxiliary electrode 300 is set to greater than the conductivity of the second electrode 500 and the conductivity of the reflective electrode 610.

Figure 16:
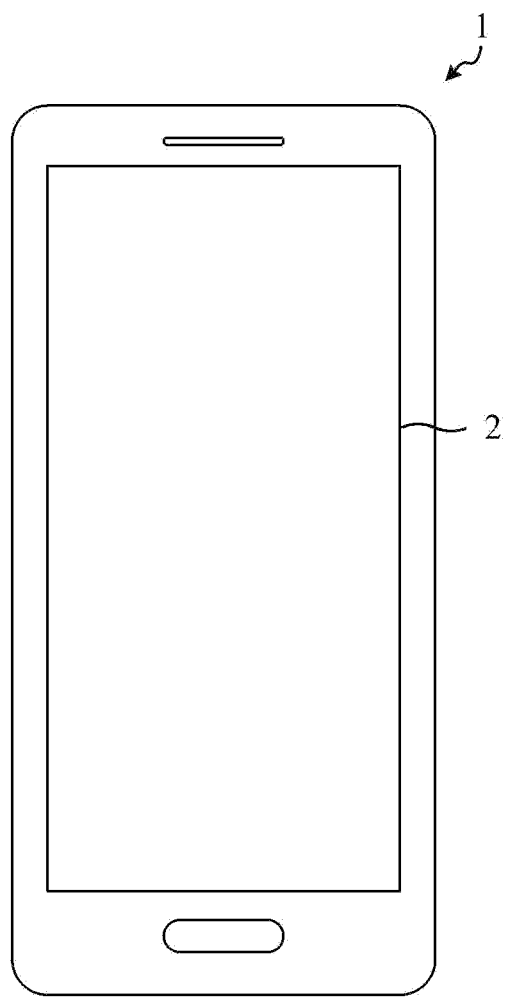
FIG. 16 is a structural schematic view illustrating a display device according to the embodiments of the present disclosure.

FIG. 16 is a structural schematic view illustrating a display device according to the embodiments of the present disclosure. As shown in FIG. 16, the display device 1 includes the display panel 2 provided in any embodiment of the present disclosure. The display device 1 provided in this embodiment of the present disclosure includes the display panel 2 of any embodiment of the present disclosure and has the technical features of the display panel 2 of any embodiment of the present disclosure. The display device 1 provided in this embodiment of the present disclosure has beneficial effects that are the same as or correspond to the beneficial effects of the display panel 2 included in the display device 1 of this embodiment. The details are not repeated here.

Figure 17:
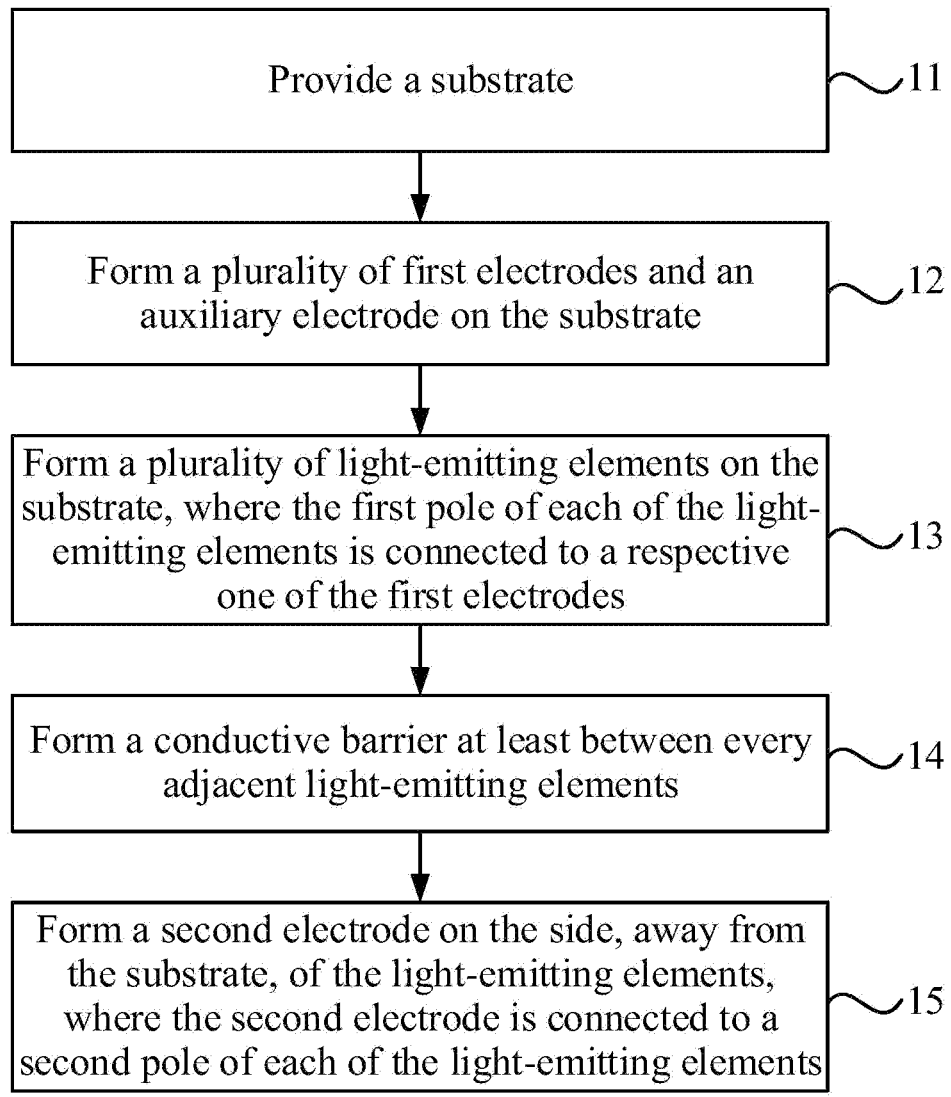
FIG. 17 is a flowchart of a method for manufacturing a display panel according to the embodiments of the present disclosure.

FIG. 17 is a flowchart of a method for manufacturing a display panel according to the embodiments of the present disclosure. The manufacturing method is used for manufacturing the display panel provided in any embodiment of the present disclosure. As shown in FIG. 17, the method for manufacturing a display panel includes the steps below.

In step 11, a substrate is provided.

It is to be noted that the type of the substrate is not limited in this embodiment.

Exemplarily, the substrate may be a glass substrate or a flexible substrate.

In step 12, a plurality of first electrodes and an auxiliary electrode are formed on the substrate.

It is to be noted that the order in which the first electrodes and the auxiliary electrode are formed is not limited in this embodiment and may be configured reasonably according to the actual structure of the display panel.

In step 13, a plurality of light-emitting elements are formed on the substrate. The first pole of each of the light-emitting elements is connected to a respective one of the first electrodes.

Exemplarily, the first electrode may be, for example, an anode, the light-emitting element may be, for example, a micro-LED, and the first pole of the light-emitting element corresponds to the P electrode of the micro-LED.

In step 14, a conductive barrier is formed at least between two adjacent light-emitting elements.

In step 15, a second electrode is formed on the side, away from the substrate, of the light-emitting elements. The second electrode is connected to the second pole of each light-emitting element. The conductive barrier is electrically connected to a second pole of each of the light-emitting elements. Each of lateral surfaces of the conductive barrier facing a respective adjacent light-emitting element is provided with a reflective electrode, and the reflective electrode is configured to reflect light emitted by the respective light-emitting element.

In the technical solution provided in this embodiment of the present disclosure, a substrate including a plurality of first electrodes and an auxiliary electrode is formed; a plurality of light-emitting elements are formed on the substrate, where the first pole of each light-emitting element is connected to a respective first electrode; a conductive barrier is formed at least between two adjacent light-emitting elements; and a second electrode is formed on the side, away from the substrate, of the light-emitting elements. The second electrode is connected to a second pole of each light-emitting element. The conductive barrier is electrically connected to the auxiliary electrode and the second electrode. Each of the lateral surfaces of the conductive barrier facing a respective adjacent light-emitting element is provided with a reflective electrode, and the reflective electrode is configured to reflect light emitted by the respective light-emitting element. Thus, a cathode signal on the auxiliary electrode is applied to the second pole of each light-emitting element through the conductive barrier and the second electrode. The auxiliary electrode is located at least between two adjacent light-emitting elements, so the signal transmission path between the auxiliary electrode and the light-emitting element is shorter, and the voltage drop of the cathode signal is smaller. Thus, the brightness of the display panel can be larger in the case of a smaller cathode signal. In this manner, the power consumption of the display panel is reduced, and the luminescence efficiency of the display panel is improved.

Figure 18:
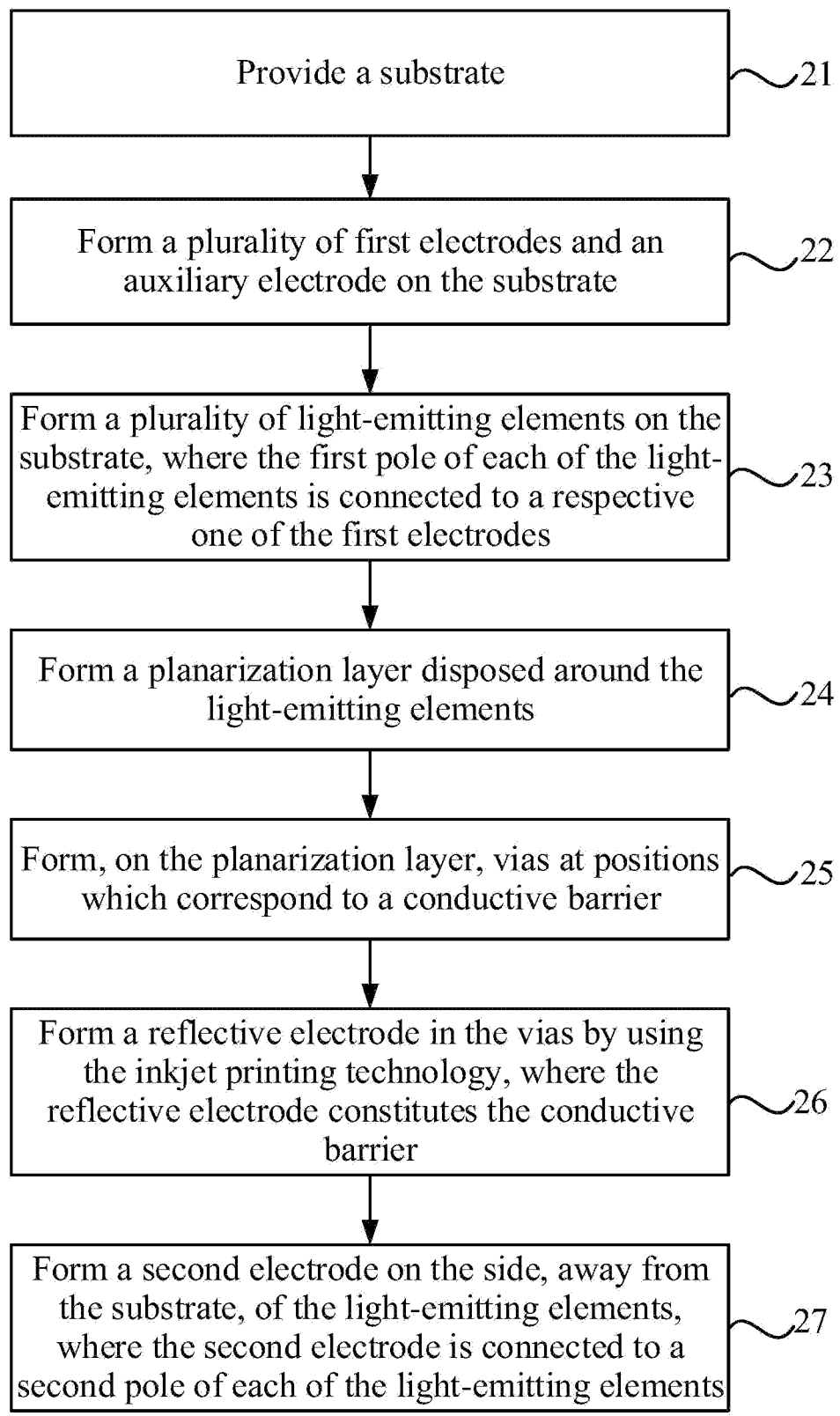
FIG. 18 is a flowchart of another method for manufacturing a display panel according to the embodiments of the present disclosure.

FIG. 18 is a flowchart of another method for manufacturing a display panel according to the embodiments of the present disclosure. As shown in FIG. 18, the method for manufacturing a display panel includes the steps below.

In step 21, a substrate is provided.

Figure 19:
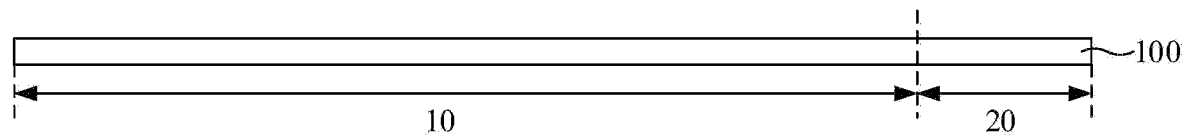
FIGS. 19 to 24 are views illustrating a process of manufacturing a display panel according to the embodiments of the present disclosure.

Referring to FIG. 19, a substrate 100 is provided.

In step 22, a plurality of first electrodes and an auxiliary electrode are formed on the substrate.

Figure 20:
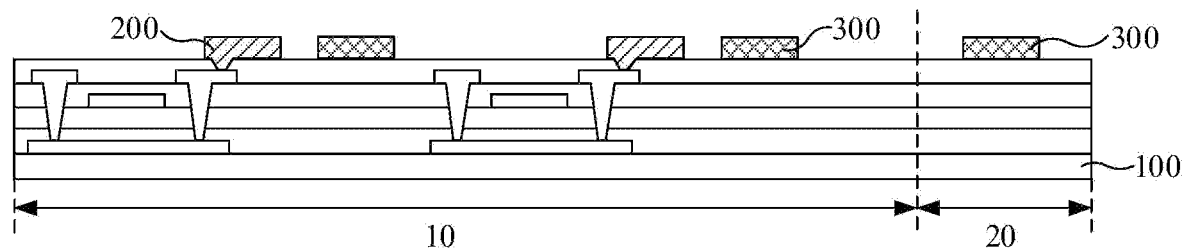

Referring to FIG. 20, a plurality of first electrodes 200 and an auxiliary electrode 300 are formed on the substrate 100.

In step 23, a plurality of light-emitting elements are formed on the substrate. The first pole of each of the light-emitting elements is connected to a respective one of the first electrodes.

Figure 21:
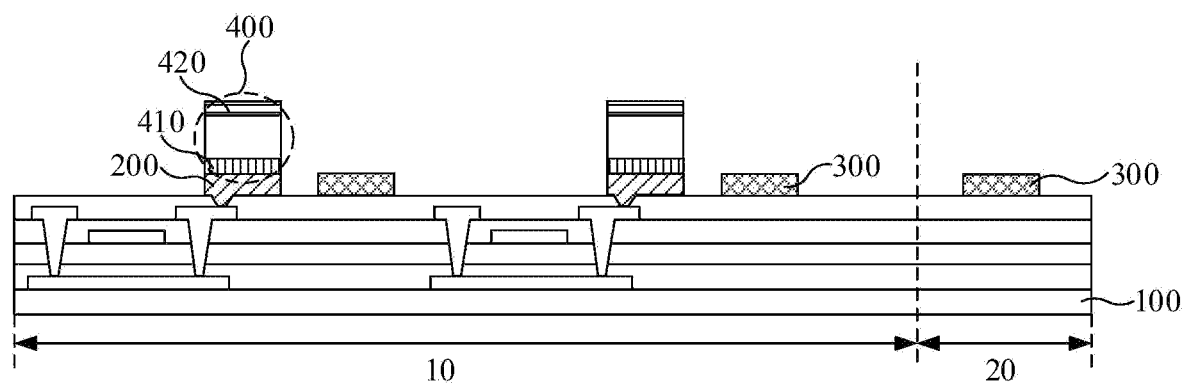

Referring to FIG. 21, a plurality of light-emitting elements 400 are formed on the substrate 100. The first pole of each light-emitting element 400 is connected to a respective first electrode 200.

In step 24, a planarization layer is formed and disposed around the light-emitting elements.

Figure 22:
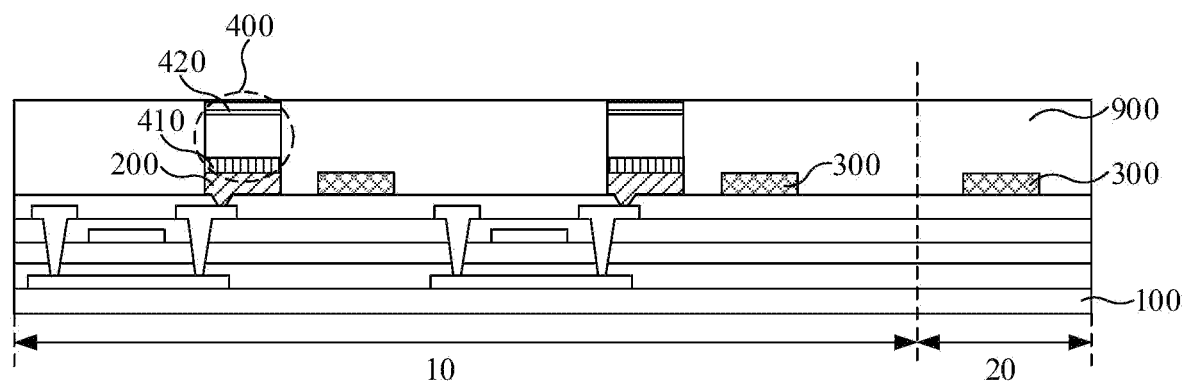

Referring to FIG. 22, a planarization layer 900 is formed and disposed around the light-emitting elements.

In step 25, on the planarization layer, vias are formed at positions which correspond to a conductive barrier.

Figure 23:
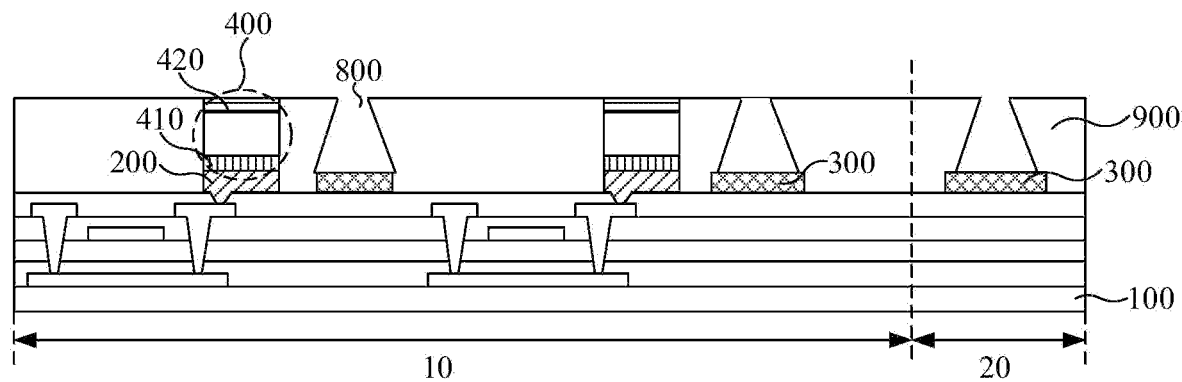

Referring to FIG. 23, on the planarization layer 900, vias 800 are formed at positions that correspond to the conductive barrier. The vias pass through the planarization layer 900 so that parts of the surface of the auxiliary electrode 300 are exposed.

In step 26, a reflective electrode is formed in the vias by using the inkjet printing technology. The reflective electrode constitutes the conductive barrier.

Figure 24:
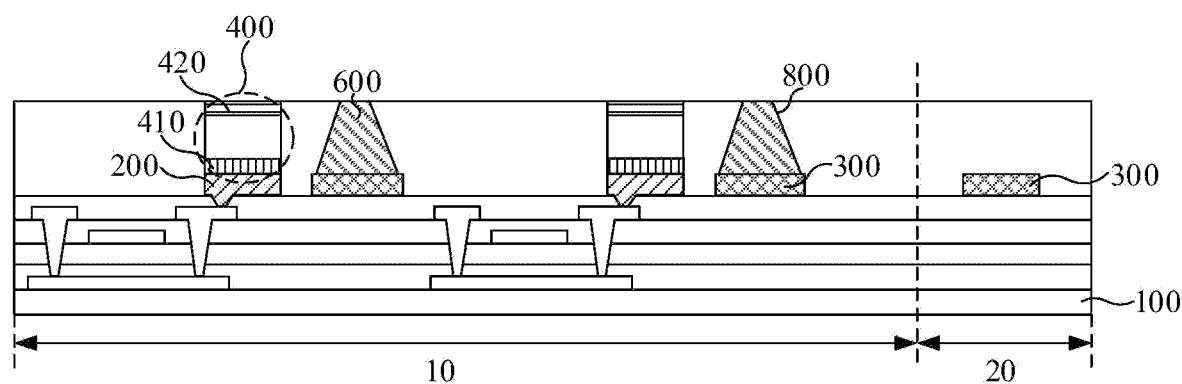

Referring to FIG. 24, a reflective electrode 600 is formed in the vias by using the inkjet printing technology. The reflective electrode constitutes the conductive barrier.

Exemplarily, the conductive barrier is an integral metal structure. The conductive barrier formed using the inkjet printing technology involves a simple process and has good performance.

In step 27, a second electrode is formed on the side, away from the substrate, of the light-emitting elements. The second electrode is connected to a second pole of each of the light-emitting elements. The conductive barrier is electrically connected to the auxiliary electrode and the second electrode. Each of lateral surfaces of the conductive barrier facing a respective adjacent light-emitting element is provided with a reflective electrode, and the reflective electrode is configured to reflect light emitted by the respective light-emitting element.

A second electrode 500 is formed on the side, away from the substrate 100, of the light-emitting elements 400. The second electrode 500 is connected to the second pole 420 of each light-emitting element 400 so that the display panel as shown in FIG. 10 is obtained.

Figure 25:
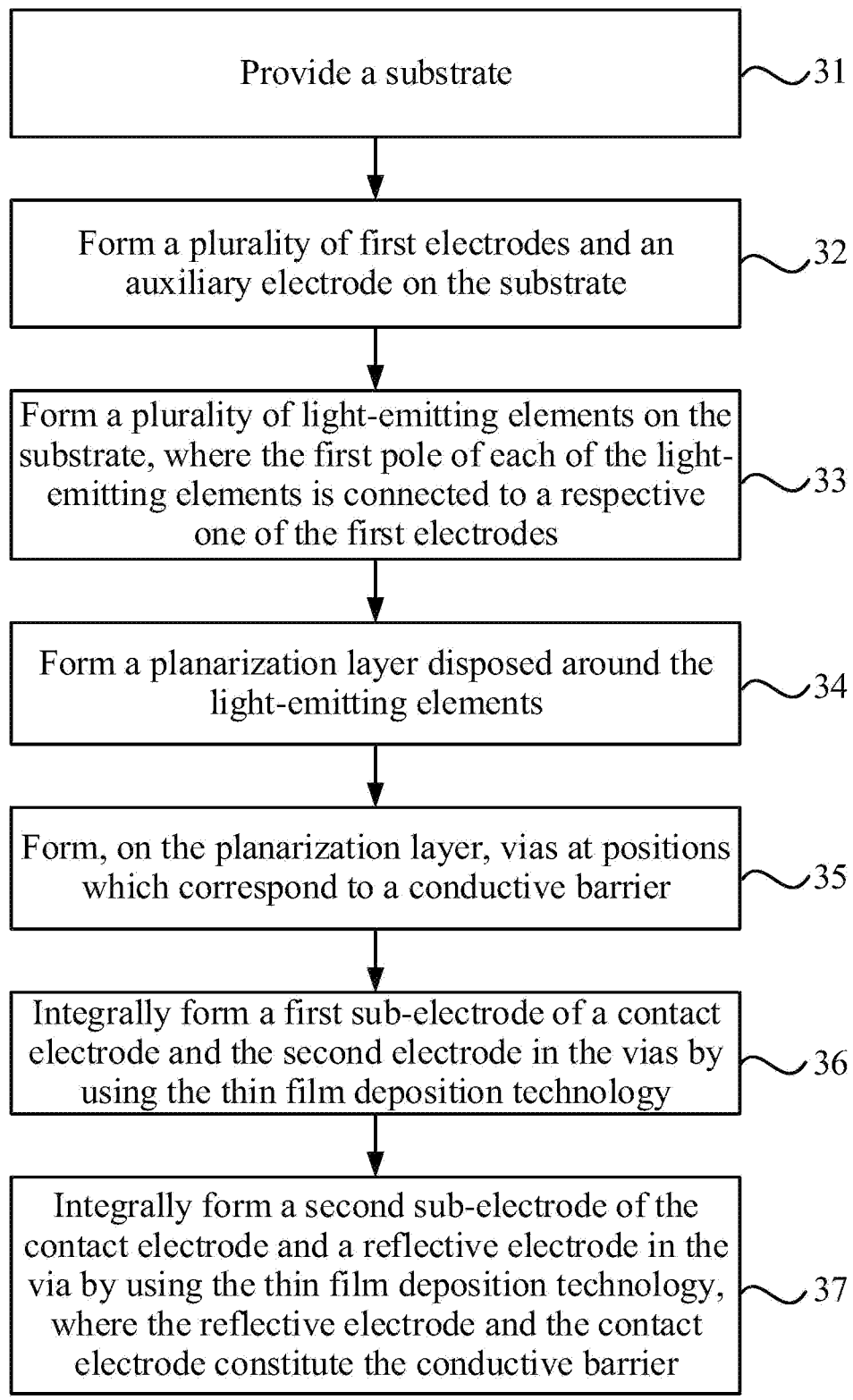
FIG. 25 is a flowchart of another method for manufacturing a display panel according to the embodiments of the present disclosure.

FIG. 25 is a flowchart of another method for manufacturing a display panel according to the embodiments of the present disclosure. As shown in FIG. 25, the method for manufacturing a display panel includes the steps below.

In step 31, a substrate is provided.

Referring to FIG. 19, a substrate 100 is provided.

In step 32, a plurality of first electrodes and an auxiliary electrode are formed on the substrate.

Referring to FIG. 20, a plurality of first electrodes 200 and an auxiliary electrode 300 are formed on the substrate 100.

In step 33, a plurality of light-emitting elements are formed on the substrate. The first pole of each of the light-emitting elements is connected to a respective one of the first electrodes.

Referring to FIG. 21, a plurality of light-emitting elements 400 are formed on the substrate 100. The first pole of each light-emitting element 400 is connected to a respective first electrode 200.

In step 34, a planarization layer is formed and disposed around the light-emitting elements.

Referring to FIG. 22, a planarization layer 900 is formed and disposed around the light-emitting elements.

In step 35, on the planarization layer, vias are formed at positions which correspond to a conductive barrier.

Figure 26:
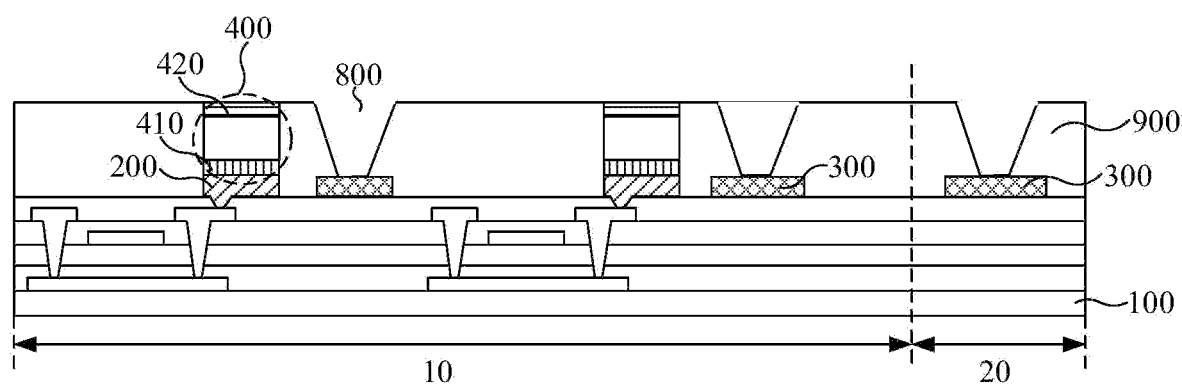
FIGS. 26 and 27 are views illustrating a process of manufacturing a display panel according to the embodiments of the present disclosure.

Referring to FIG. 26, on the planarization layer 900, vias 800 are formed at positions that correspond to a conductive barrier.

In step 36, a first sub-electrode of a contact electrode and the second electrode are integrally formed in the vias by using the thin film deposition technology.

Figure 27:
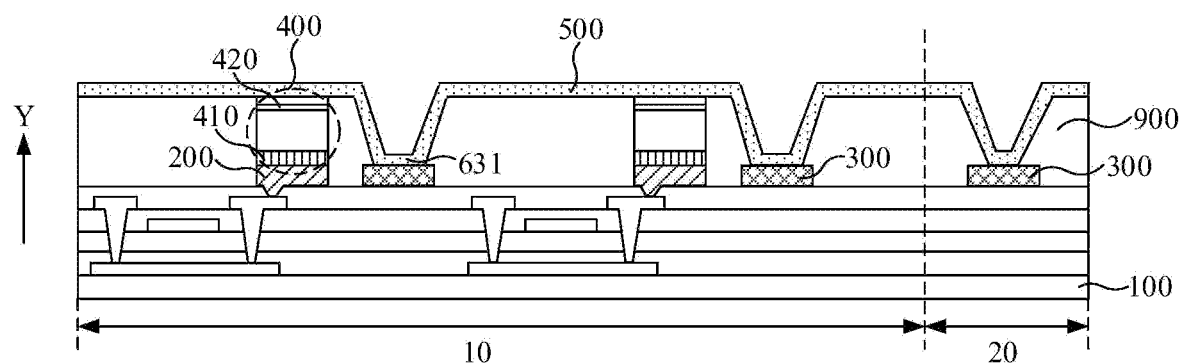

Referring to FIG. 27, a first sub-electrode 631 of a contact electrode 630 and the second electrode 500 are integrally formed in the vias by using the thin film deposition technology.

Exemplarily, the thin film deposition technology may be, for example, magnetron sputtering or electron beam evaporation.

It is to be noted that with the thin film deposition technology, a film of a smaller thickness can be formed, and through adjustment of technical parameters, the performance of the formed film can be changed so that a thinned film with better performance can be obtained easily. Since the second electrode 500 is usually a transparent conductive film of a relatively small thickness, the original performance of the second electrode 500 can be retained in the case where the first sub-electrode 631 and the second electrode 500 are integrally formed by the thin film deposition technology.

In step 37, a second sub-electrode of the contact electrode and a reflective electrode are integrally formed in the vias by using the thin film deposition technology. The reflective electrode and the contact electrode constitute the conductive barrier.

A second sub-electrode 632 of the contact electrode 630 and a reflective electrode 610 are integrally formed in the vias by using the thin film deposition technology. The reflective electrode 610 and the contact electrode 630 constitute the conductive barrier 600 so that the display panel as shown in FIG. 7 is obtained.

It is to be noted that the second sub-electrode 632 and the reflective electrode 610 integrally formed by using the thin film deposition technology are thin films of a relatively small thickness that cover the upper surfaces of the integrally formed first sub-electrode 631 and second electrode 500. The groove structure in the via may be retained to facilitate subsequent arrangement of structures like a light-blocking layer.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A display panel, comprising:
   a substrate having a top side and a bottom side;
   a plurality of first electrodes and an auxiliary electrode disposed on the top side of the substrate;
   a plurality of light-emitting elements, which are on a side, facing away from the substrate, of first electrodes and the auxiliary electrode, wherein a first pole of one of the plurality of light-emitting elements is connected to one of the plurality of first electrodes;
   a second electrode disposed on the plurality of light-emitting elements, wherein the second electrode is connected to a second pole of one of the plurality of light-emitting elements; and
   a conductive barrier disposed between two adjacent ones of the plurality of light-emitting elements, wherein the conductive barrier is electrically connected to the auxiliary electrode and the second electrode, wherein the conductive barrier comprises two sidewalls, wherein each of the two sidewalls comprises a reflective electrode, and wherein the reflective electrode reflects light emitted from an adjacent one of the plurality of light-emitting elements;
   wherein the auxiliary electrode comprises hollowed-out structures, and perpendicular projections of the plurality of light-emitting elements on the layer where the auxiliary electrode is located fall in the hollowed-out structures.

2. The display panel of claim 1, wherein the reflective electrode has a reflectivity rate a for visible light at: a≥30%, where a is the reflectivity of the reflective electrode.

3. The display panel of claim 1, wherein the two sidewalls of the conductive barrier and the auxiliary electrode form a groove, wherein an angle between one of the two sidewalls of the conductive barrier and a bottom surface of the groove is less than 90°.

4. The display panel of claim 1, wherein the conductive barrier further comprises a contact electrode disposed on and in contact with a side of the auxiliary electrode.

5. The display panel of claim 4, wherein the conductive barrier is a metal barrier, and the reflective electrode and the contact electrode are made of a same material as the metal barrier.

6. The display panel of claim 4, wherein the contact electrode and the reflective electrode are integrally formed and comprise a same material.

7. The display panel of claim 4, wherein the contact electrode and the second electrode are integrally formed and comprise a same material.

8. The display panel of claim 4, wherein the contact electrode comprises a first sub-electrode and a second sub-electrode, wherein the first sub-electrode and the second sub-electrode are stacked in a first direction, and wherein the first direction is a direction perpendicular to a surface of the substrate;
   wherein the first sub-electrode and the second electrode are integrally formed of a same material; and
   wherein the second sub-electrode and the reflective electrode are integrally formed a same material.

9. The display panel of claim 4, wherein the reflective electrode and the contact electrode form a groove structure.

10. The display panel of claim 9, further comprising a light-blocking layer disposed on the conductive barrier, wherein the light-blocking layer covers the reflective electrode; and
    wherein the light-blocking layer fills the groove structure.

11. The display panel of claim 1, further comprising a light-blocking layer disposed on the conductive barrier, wherein the light-blocking layer covers the reflective electrode in a direction perpendicular to the substrate.

12. The display panel of claim 1, wherein the auxiliary electrode and the plurality of first electrodes are disposed in a same layer.

13. The display panel of claim 1, wherein the auxiliary electrode is disposed in a layer between the plurality of first electrodes and the second electrode.

14. The display panel of claim 1, wherein the auxiliary electrode has a grid structure, wherein perpendicular projections of the plurality of light-emitting elements on a plane where the auxiliary electrode is located fall in openings of the grid structure; wherein the conductive barrier comprises a plurality of sub-conductive barriers, wherein each of the plurality of sub-conductive barriers is in one-to-one correspondence with one of the plurality of light-emitting elements, and wherein each of the plurality of sub-conductive barriers is disposed around one of the plurality of light-emitting elements in the one-to-one correspondence.

15. The display panel of claim 1, wherein a conductivity of the auxiliary electrode is m, a conductivity of the second electrode is n, and a conductivity of the reflective electrode is p, wherein m>n, and m>p.

16. A display device, comprising a display panel, wherein the display panel comprises:
    a substrate having a top side and a bottom side;
    a plurality of first electrodes and an auxiliary electrode disposed on the top side of the substrate;
    a plurality of light-emitting elements, which are on a side, facing away from the substrate, of first electrodes and the auxiliary electrode, wherein a first pole of one of the plurality of light-emitting elements is connected to one of the plurality of first electrodes;

a second electrode disposed on the plurality of light-emitting elements, wherein the second electrode is connected to a second pole of one of the plurality of light-emitting elements; and a conductive barrier disposed between two adjacent ones of the plurality of light-emitting elements, wherein the conductive barrier is electrically connected to the auxiliary electrode and the second electrode, wherein the conductive barrier comprises two sidewalls, wherein each of the two sidewalls comprises a reflective electrode, and wherein the reflective electrode reflects light emitted from an adjacent one of the plurality of light-emitting elements, wherein the auxiliary electrode comprises hollowed-out structures, and perpendicular projections of the plurality of light-emitting elements on the layer where the auxiliary electrode is located fall in the hollowed-out structures.

17. The display panel of claim 1, wherein at least one of the plurality of light-emitting elements is a micro light-emitting diode (micro-LED) or an organic light-emitting diode (OLED).

18. The display panel of claim 1, wherein a conductivity of the reflective electrode is less than a conductivity of the second electrode.

19. The display device of claim 16, wherein the conductive barrier further comprises a contact electrode disposed on and in contact with a side of the auxiliary electrode.

20. The display device of claim 16, wherein the display panel further comprises a light-blocking layer disposed on the conductive barrier, wherein the light-blocking layer covers the reflective electrode in a direction perpendicular to the substrate.

* * * * *